United States Patent
Nakasuji

(10) Patent No.: US 6,444,399 B1
(45) Date of Patent: Sep. 3, 2002

(54) METHODS FOR ACHIEVING REDUCED EFFECTS OF OVERLAYER AND SUBFIELD-STITCHING ERRORS IN CHARGED-PARTICLE-BEAM MICROLITHOGRAPHY, AND DEVICE MANUFACTURING METHODS COMPRISING SUCH MICROLITHOGRAPHY METHODS

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/514,985

(22) Filed: Feb. 29, 2000

(30) Foreign Application Priority Data

Mar. 9, 1999 (JP) ............................................ 11-061348

(51) Int. Cl.⁷ ................................................ G03C 5/00
(52) U.S. Cl. ....................................... 430/311; 430/296
(58) Field of Search .................................. 420/296, 311

(56) References Cited

U.S. PATENT DOCUMENTS 5,895,925 A  4/1999  Nakasuji ................ 250/492.22
6,072,184 A  * 6/2000  Okino et al. ............. 250/492.2
6,204,912 B1 * 3/2001  Tsuchiya et al. .............. 355/53

FOREIGN PATENT DOCUMENTS

JP   11-329945    11/1999

* cited by examiner

Primary Examiner—Rosemary Ashton
(74) Attorney, Agent, or Firm—Klarquist Sparkman LLP

(57) ABSTRACT

In the context of charged-particle-beam microlithography as used to transfer a pattern, defined by a segmented reticle, to a sensitive substrate, methods are disclosed for reducing the occurrence of defects caused by subfield-stitching errors and/or overlayer errors. The methods are especially useful in semiconductor-device fabrication situations in which multiple pattern layers are projection-transferred to a wafer. In defining the segmented reticle for a pattern layer, subfield boundaries are established so as to cross pattern elements at locations other than where stitching or overlayer accuracy is critical. E.g., subfield boundaries are not passed through gate, source, or drain regions of transistors.

7 Claims, 6 Drawing Sheets

METHODS FOR ACHIEVING REDUCED EFFECTS OF OVERLAYER AND SUBFIELD-STITCHING ERRORS IN CHARGED-PARTICLE-BEAM MICROLITHOGRAPHY, AND DEVICE MANUFACTURING METHODS COMPRISING SUCH MICROLITHOGRAPHY METHODS

FIELD OF THE INVENTION

This invention pertains to microlithography (projection-transfer) of a pattern, defined by a reticle, to a sensitive substrate using a charged particle beam as an energy beam. Microlithography is used generally in the fabrication of semiconductor integrated circuits and displays. More specifically, the invention pertains to microlithography methods in which adverse effects of errors of pattern overlayer and subfield stitching are reduced.

BACKGROUND OF THE INVENTION

Charged-particle-beam (CPB) microlithography is a promising method for used in fabrication of semiconductor integrated circuits, displays, and other devices demanding the accurate transfer of extremely fine patterns (having linewidths of 0.1 $\mu$m or less).

Much current development effort is aimed at producing a practical CPB microlithography apparatus that can achieve desired transfer accuracy at an acceptable throughput. One current impediment to achieving acceptable throughput is that the pattern for an entire semiconductor device ("chip") cannot be projection-transferred at one time using CPB microlithography. This is because, inter alia, producing a CPB optical system having an optical field sufficiently large to image an entire chip-layer pattern has not been accomplished. Hence, the pattern, as defined on a reticle, is divided or segmented into pattern portions usually termed "subfields" that are individually exposed according to a pre-established order.

The projected images of the subfields on the wafer (or other suitable sensitive substrate) desirably are situated contiguously with respect to each other so that the images are "stitched" together in a manner that forms the entire pattern on the wafer. A reticle for this type of pattern transfer is termed a "divided" or "segmented" reticle, and microlithography performed using such a reticle is termed "divided-reticle" microlithography.

In a segmented reticle, each subfield is dimensioned to fit within the optical field of the CPB optical system. Progression of exposure from one subfield to the next can occur either by scanning the charged particle beam in a continuous manner or by stepwise motion of the respective stages on which the reticle and wafer are mounted.

According to a conventional approach, the reticle is divided into subfields all identically sized and each having a square or rectangular profile. When dividing a pattern in this manner, it is inevitable that subfield boundaries will extend across conductor lines and other pattern features. When projected onto the wafer, such conductor lines and the like must be imaged such that intact connections of conductors are established properly between adjacent subfields (i.e., the subfields are properly "stitched" together on the wafer). As a first example, if the projected images of adjacent subfields containing an interconnecting conductor are not located properly on the wafer, then a break or short can be formed in the conductor as imaged on the wafer. As a second example, if a pattern element extending between a source and a gate of a transistor or between a gate and a drain of a transistor of a semiconductor device crosses a subfield boundary, and if a subfield-stitching defect occurs at that intersection, then the yield of fully functional semiconductor devices is compromised. The incidence frequency of "subfield-stitching" defects (i.e., defects in the manner in which pattern elements extending across subfield boundaries are connected together between adjacent subfields as projected) increases with an increase in the number of locations on the wafer where subfield boundaries and pattern features intersect. As semiconductor devices (e.g., microprocessors and memories) become increasingly complex and miniaturized, subfield-stitching and layer-registration defects experienced during fabrication steps involving CPB microlithography tend to increase. This results in substantial loss of production efficiency and loss of salable product through rejects.

Interconnection defects as summarized above can occur in a single layer of a semiconductor device; single-layer errors generally are termed "subfield-stitching" errors as noted above. Similar errors can also occur between layers as formed on the wafer, and multi-layer errors generally are termed "overlayer" errors or "pattern-registration" errors.

Therefore, there is a need for CPB microlithography methods exhibiting a significantly reduced incidence of subfield-stitching and overlayer defects in the patterns as projected onto a wafer.

SUMMARY OF THE INVENTION

In view of the shortcomings of the prior art as summarized above, an object of the invention is to provide CPB microlithography methods in which defects arising from subfield-stitching errors and/or overlayer errors are reduced.

According to a first aspect of the invention, methods are provided in which a pattern, to be transferred to a sensitive substrate ("wafer") by CPB microlithography, is divided on the reticle into multiple subfields. As the subfields are projection-transferred onto the wafer, the projected subfields are positioned so as to stitch together the subfield images in a way that forms the entire pattern. On the reticle, subfield boundaries are established apart from regions and areas of the pattern where stitching accuracy of the projected pattern must be relatively high compared to other regions and areas of the pattern. For example, a source or drain of a transistor is normally defined in a diffusion layer. A gate electrode, defined in a subsequently applied layer, must be applied with very high positional accuracy to the diffusion layer. A subfield boundary is not provided in such a region.

According to another embodiment of methods according to the invention, if a subfield boundary must cross a pattern element, such crossing of the element by the boundary is made where the element has an internal angle of 225 degrees or greater. By making the intersection in such a region, the probability of a break occurring in the pattern element (as projected onto the wafer) is low in the event of a subfield-stitching error or dislocation in the respective subfields as projected. I.e., at a region of a pattern element characterized by such a large internal angle, proximity effects tend to compensate for situations that otherwise would have a higher probability of causing a break in the element crossing the boundary. The internal angle desirably is at least 225 degrees so as to adequately distinguish from the very common internal angle of 180 degrees.

According to yet another embodiment, the subfield boundaries of each layer are at different relative locations, established independently in each layer. Hence, it is possible to make the subfield (and pattern feature) connections in each pattern layer inconspicuous.

The foregoing and additional features and advantages of the invention will be more readily apparent from the following detailed description, which proceeds with reference to the accompanying drawings.

BRIEF DESCRIPTION OF THE DRAWINGS

According to another embodiment of methods according to the invention, if a subfield boundary must cross a pattern element, such crossing of the element by the boundary is made where the element has an internal angle of 225 degrees or greater. By making the intersection in such a region, the probability of a break occurring in the pattern element (as projected onto the wafer) is low in the event of a subfield-stitching error or dislocation in the respective subfields as projected. i.e., at a region of a pattern element characterized by such a large internal angle, proximity effects tend to compensate for situations that otherwise would have a higher probability of causing a break in the element crossing the boundary. The internal angle desirably is at least 225 degrees so as to adequately distinguish from the very common internal angle of 180 degrees.

FIG. 5(A) is a plan view of the reticle, FIG. 5(B) is an oblique view of a portion of the reticle, and FIG. 5(C) is a plan view of a subfield of the reticle.

DETAILED DESCRIPTION

The following description is given in the context of electron-beam microlithography. However, it will be understood that the general principles described herein can be applied with ready facility to use of an alternative charged particle beam such as an ion beam.

Figure 4:
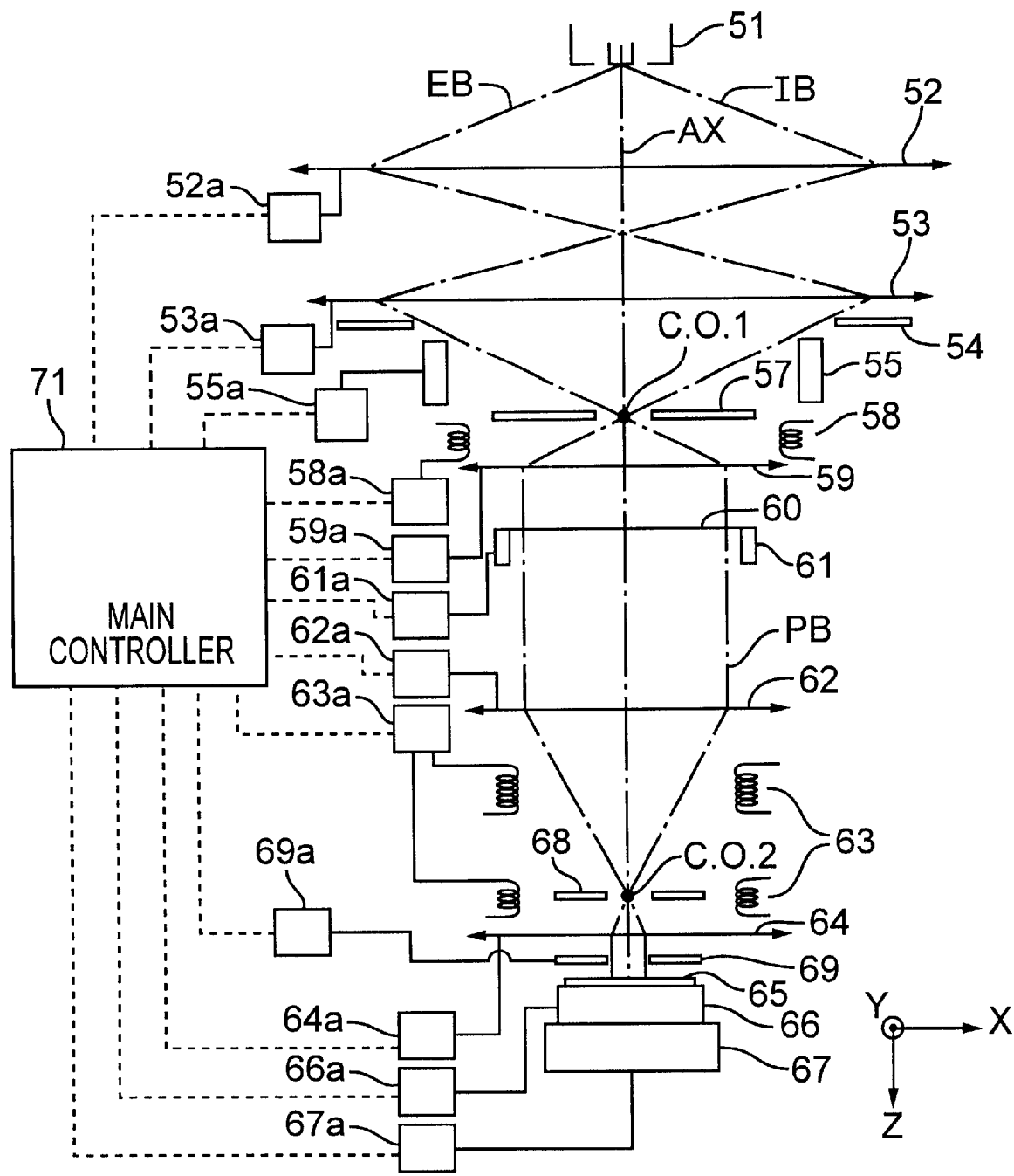
FIG. 4 is a schematic elevational depiction of principal components of the CPB-optical system and associated control systems of a divided-reticle CPB microlithography apparatus.

Certain aspects of a divided-reticle electron-beam microlithography system, to which methods according to the invention are applied, are depicted in FIG. 4, in which the most upstream component shown is an electron gun 51. The electron gun 51 emits an electron beam EB that propagates in a downstream direction along an optical axis AX. Downstream of the electron gun 51 are first and second condenser lenses 52, 53, respectively. The electron beam EB passes through the condenser lenses 52, 53 to form a first crossover C.O.1. The first crossover C.O.1 is located on the optical axis AX at a blanking aperture 57.

A beam-shaping aperture 54 is situated between the second condenser lens 53 and the blanking aperture 57. The beam-shaping aperture 54 defines an axial opening that is sized and shaped to pass therethrough only a portion of the electron beam EB sufficient to illuminate a single exposure unit (or "subfield") of a downstream reticle 60. For example, if the subfields on the reticle 60 are rectangular in shape (each subfield on the reticle usually is sized and shaped identically), then the beam-shaping aperture 54 defines a corresponding rectangular axial opening. By way of another example, if the subfields on the reticle 60 are square in shape and have an area of $(1\ \text{mm})^2$, then the beam-shaping aperture 54 defines an axial opening sufficient to provide the electron beam, as incident on the reticle, with a square transverse profile with each side of the square being slightly greater than 1 mm. An image of the axial opening defined by the beam-shaping aperture is formed on the reticle 60 by a collimating lens 59 situated between the blanking aperture 57 and the reticle 60.

The electron beam EB propagating between the electron gun 51 and the reticle 60 is termed herein the "illumination beam" IB. The corresponding portion of the electron-optical system (including the lenses 52, 53, 59 and the apertures 54, 57) is termed herein the "illumination-optical system."

The illumination-optical system also includes a blanking deflector 55 disposed downstream of the beam-shaping aperture 54. The blanking deflector 55, when energized, deflects the illumination beam IB laterally so as to cause the entire illumination beam IB to be blocked as required by the blanking aperture 57 during moments when no exposure is occurring or desired. Thus, the illumination beam IB can be prevented from impinging on the reticle 60.

The illumination-optical system also includes a selection deflector 58 situated downstream of the blanking aperture 57. The selection deflector 58 is operable to deflect the illumination beam IB in the X-, or left-right, direction (note axes shown in the figure) in a scanning manner. By scanning the illumination beam IB in this manner, successive subfields on the reticle 60 located within the field of the illumination-optical system can be illuminated. Thus, the embodiment shown in FIG. 4 can expose the subfields of the reticle 60 in a scanning manner. The collimating lens 59, situated downstream of the selection deflector 58, collimates the illumination beam IB for impingement on a desired subfield of the reticle 60. Thus, an image of the axial opening defined by the beam-shaping aperture 54 is focused on the reticle 60.

In FIG. 4, only a single subfield (centered on the optical axis AX) is shown. It will be understood that an actual reticle 60 extends outward in the X–Y plane and defines many subfields, as discussed below with reference to FIGS. 5(A)–5(B). In any event, the reticle 60 defines a pattern (chip pattern) for a single semiconductor device ("die") to be formed on a downstream substrate 65, and each subfield defines a respective portion of the pattern.

As noted above, regarding the FIG. 4 embodiment, the illumination beam IB is deflected laterally to illuminate successive subfields situated within the field of the illumination-optical system. (Hence, multiple subfields desirably fall within the field of the illumination-optical system.) To illuminate a subfield situated outside the field of the illumination-optical system, the reticle 60 is moved relative to the illumination-optical system. To such end, the reticle 60 is mounted on a reticle stage 61 that is movable in the X- and Y-directions.

As the illumination beam IB passes through the illuminated subfield on the reticle 60, the electron beam becomes capable of forming an image of the illuminated subfield on the substrate 65. Hence, the electron beam propagating downstream of the reticle 60 is termed herein the "patterned beam" PB. The electron-optical system located between the reticle 60 and the substrate 65 is concerned primarily with projecting the image onto the desired location on the reticle 65. Hence, the electron-optical system located between the reticle 60 and substrate 65 is termed herein the "projection-optical system."

The projection-optical system includes first and second projection lenses 62, 64, respectively, and a deflector 63. The first and second projection lenses operate in concert to form a "reduced" image of the illuminated reticle subfield on the substrate 65. By "reduced" is meant that the image as formed on the substrate is smaller than, or "demagnified" relative to, the corresponding illuminated portion of the reticle 60 by a factor termed the "demagnification ratio." The demagnification ratio is usually an integer factor such as ¼ or ⅕.

The deflector 63 laterally deflects the patterned beam as required to cause the patterned beam to form the image of the illuminated subfield at a desired location on the substrate 65. The surface of the substrate (or "wafer") 65 is coated with an appropriate resist so as to be imprinted with the demagnified image when dosed by the patterned beam PB. The demagnified images of successively illuminated subfields are formed on the wafer 65 such that all the images are contiguous with each other (i.e., "stitched" together) in the proper order and arrangement to form the complete die pattern on the wafer. Proper stitching together of the images on the wafer 65 is facilitated by mounting the wafer 65 on a wafer stage 67 that is moved controllably as required in the X- and Y-directions and by deflecting each image using the deflector 63.

The first projection lens 62 causes the patterned beam PB to form a second crossover C.O.2 on the optical axis upstream of the second projection lens 64. At the second crossover C.O.2, the axial distance between the reticle 60 and wafer 65 is divided such that the axial distance from the reticle 60 to the second crossover C.O.2, divided by the axial distance from the second crossover C.O.2 to the wafer 65, is equal to the demagnification ratio. The second crossover C.O.2 is also the location, along the optical axis AX, of a "contrast aperture" 68. The contrast aperture 68 blocks charged particles in the patterned beam PB that were scattered upstream by particles of the illumination beam encountering non-patterned regions of the reticle 60. Thus, the scattered particles are prevented from propagating to the wafer 65.

A backscattered-electron (BSE) detector 69 is situated between the second projection lens 64 and the wafer 65. The BSE detector 69 detects backscattered electrons produced when the patterned beam PB strikes certain regions (e.g., alignment marks or analogous features) on the wafer 65. The positions of the alignment marks on the wafer 65 can be ascertained from characteristics of the BSE signal produced by the BSE detector 69. Thus, basic data concerning alignments between the wafer 65 and the electron-optical system or between the wafer 65 and reticle 60 can be obtained.

The wafer 65 desirably is mounted on an electrostatic chuck 66 that, in turn, is mounted on the wafer stage 67. The wafer stage 67 moves the chuck 66 (and thus the wafer 65) in the X- and Y-directions. The various subfields of the chip pattern on the reticle 60 can be exposed successively by synchronously scanning the reticle stage 61 and the wafer stage 67 in opposite directions. The axis along which these scannings of the stages are performed is perpendicular to the axis along which lateral beam-scanning is performed. The respective position of each stage is determined accurately using a position-measurement system employing one or more laser interferometers as known in the art. Each stage 61, 67 is equipped with its own position-measurement system. Extremely accurate positional measurements are required to obtain accurate stitching together of the demagnified images, on the wafer 65, of the illuminated reticle subfields.

The lenses 52, 53, 59, 62, 64 and the deflectors 55, 58, 63 are controlled by a main controller (e.g., microprocessor) 71 via respective coil power supplies, 52a, 53a, 59a, 62a, 64a, 55a, 58a, 63a. Also, the reticle stage 61 and wafer stage 67 are controlled by the main controller 71 via respective stage drivers 61a, 67a. The electrostatic chuck 66 is controlled by the main controller 71 via a chuck driver 66a.

A divided reticle 60 as used with the apparatus of FIG. 4 is described with reference to FIGS. 5(A)–5(C). The reticle 60 comprises a reticle membrane 92 partitioned into multiple subfields 91. The subfields 91 in this example are square-shaped and similarly sized. Depending upon the type of reticle (e.g., scattering-membrane type or scattering-stencil type), the membrane 92 has a thickness ranging from about 0.1 μm to several μm. Each subfield 91 defines a respective portion of the pattern defined by the reticle. The subfields 91 on a given reticle typically have identical size and shape (typically square or rectangular), ranging from 0,5 mm square to 5 mm square on the reticle. When projected at a demagnification ratio of ⅕, these subfields produce corresponding images on the wafer 65 measuring 0.1 mm square to 1 mm square, respectively.

Figure 5A:
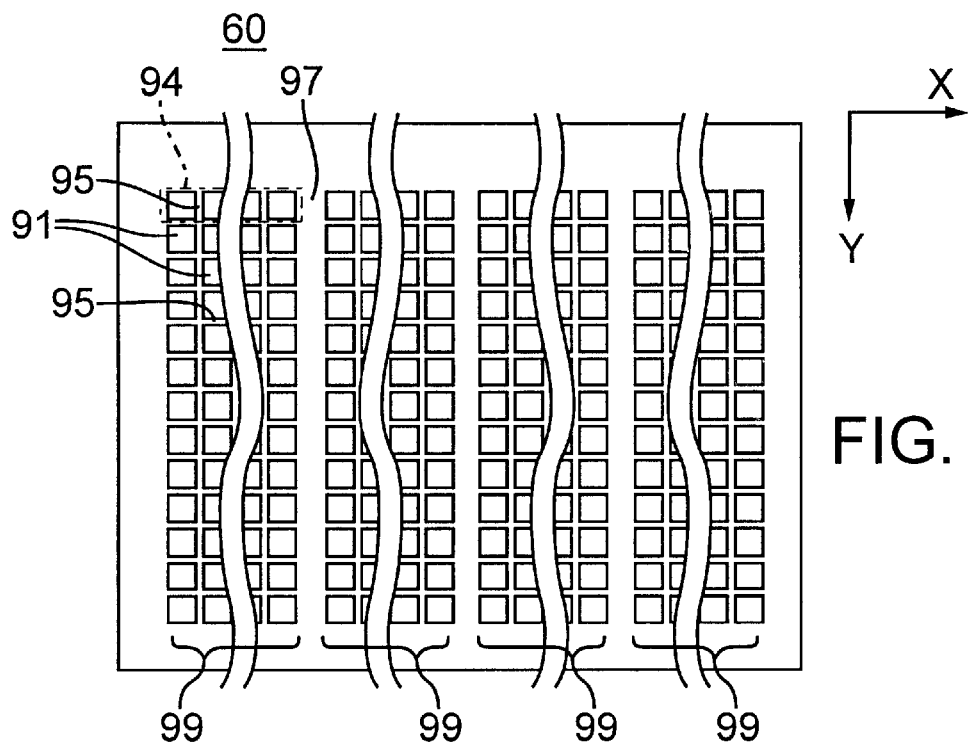
FIGS. 5(A)–5(C) schematically depict structural aspects of a representative segmented reticle as used in an electron-beam microlithography apparatus as shown in FIG. 4.
Figure 5B:
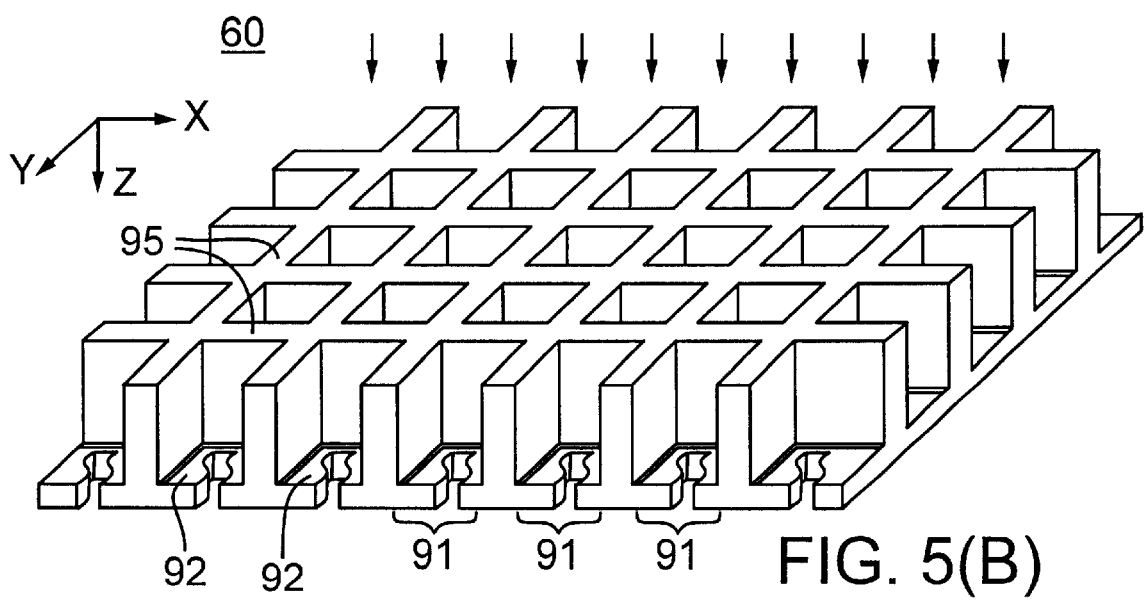
Figure 5C:
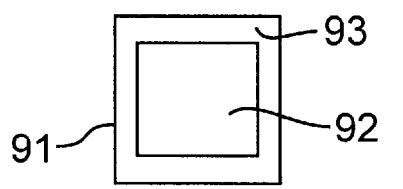

Referring to FIG. 5(C), each individual subfield 91 is surrounded by a skirt 93 that is defined on the membrane 92 but does not define any portion of the pattern. Referring to FIG. 5(B), projecting (in the Z-direction) from the membrane 92 between individual subfields 91 are struts 95 that extend lengthwise in the X- and Y-directions. Thus, in each space between intersecting struts 95 is a respective subfield 91 surrounded by a skirt 93. The struts 95 collectively form a supporting lattice (termed "grillage") for the subfield membranes 92. The thickness of each strut 95 in the Z-direction is typically 0.5 to 1 mm, and the width of each strut 95 in the X- or Y-direction is typically about 0.1 mm.

These dimensions provide the reticle 60 with substantial rigidity.

Referring to FIG. 5(A), the subfields 91 are arrayed in groups 99 termed "stripes." The stripes 99 are separated from one another by large struts 97. The large struts 97 are integral with the struts 95 separating individual subfields 91 within each stripe 99. The thickness of each large strut 97 in the Z-direction is typically 0.5 to 1 mm, and the width of each large strut 97 in the X- or Y-direction is typically several mm. The large struts 97, in combination with the grillage formed by the struts 95, further increase the rigidity and mechanical strength of the reticle 60. Each stripe 99 comprises multiple subfields 91 linearly arrayed in multiple rows 94 (each row 94 is longitudinally extended in the X-direction). Each such row 94 is termed a "deflection field" because the length of a row (in the X-direction) falls within the field of the illumination-optical system, and the length (in the X-direction) represents the maximum lateral deflection that can be imparted to the illumination beam IB by the selection deflector 58 (FIG. 4). The width of each deflection field 94 (in the Y-direction) corresponds to the width (in the Y-direction) of each subfield 91 of the deflection field 94. Thus, each deflection field 94 has a "band-shaped" profile that is longitudinally extended in a first direction (here, the X-direction) perpendicular to the optical axis AX, relative to a second direction (here, the Y-direction) perpendicular to the optical axis AX. Each stripe 99 consists of an array (extending in the Y-direction) of multiple deflection fields 94. In view of the length (in the X-direction) of each deflection field, the width of each stripe 99 is also no greater than the maximum lateral deflection, at the reticle, that can be imparted to the illumination beam IB by the selection deflector 58. The array of stripes extends across the reticle 60 in the X-direction.

The stripes 99 (and deflection fields 94 of each stripe 99) are arranged such that the subfields 91 in each deflection field 94 of each stripe can be illuminated sequentially by the illumination beam IB. That is, in a given stripe 99, the subfields 91 in each deflection field 94 are illuminated sequentially, and the deflection fields 94 are illuminated sequentially. The subfields 91 in each deflection field 94 are exposed sequentially by continuously scanning the illumination beam in the X-direction. As the beam scans the subfields 91 in a deflection field, the reticle stage 61 and wafer stage 67 are moving in the Y-direction (but in opposite directions) to position the next deflection field 94 for scanning after completing scanning of the current deflection field. When exposure of a stripe 99 is complete, scanning motions of the illumination beam and stages stop momentarily for the reticle stage 61 and wafer stage 67 to move stepwise to respective positions appropriate for beginning exposure of the next stripe 99.

During projection exposure of the subfields 91, areas of the reticle in the skirts 93 (including the grillage) are not exposed. Hence, the positions of the corresponding subfield images on the wafer 65 must be such that all the images of the pattern are contiguous with each other on the wafer (i.e., the images are properly "stitched together"). By way of example, if the demagnification ratio is ⅕, a die as formed on the wafer measuring 27×44 mm (e.g., for a 4-gigabit DRAM) would have a size on the reticle (including grillage) of approximately 150×230 mm to 200×350 mm.

Figure 1:
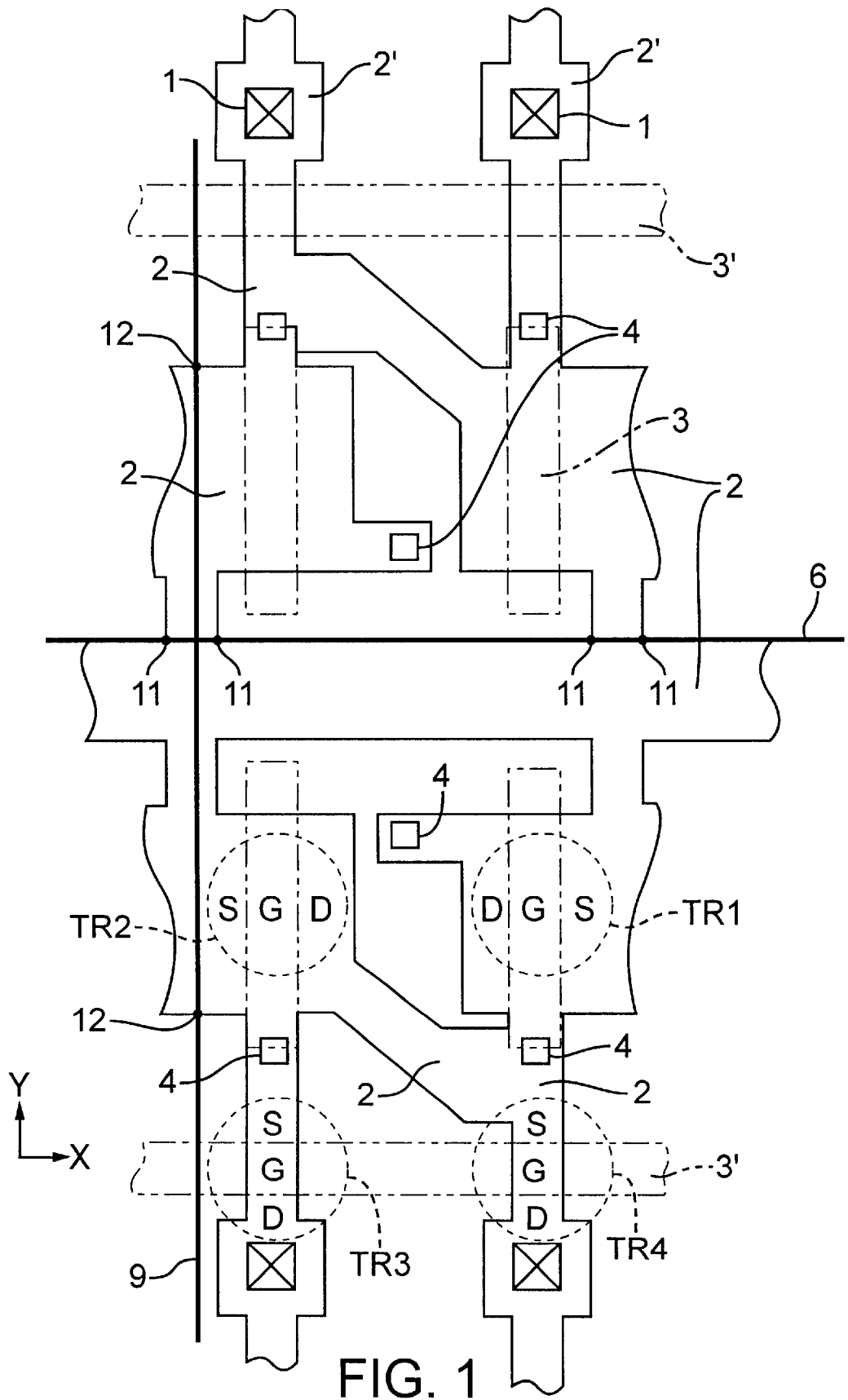
FIG. 1 is a plan view of exemplary pattern elements of an SRAM cell, including a subfield having boundaries established (relative to pattern features) according to a representative embodiment of the invention.
Figure 2:
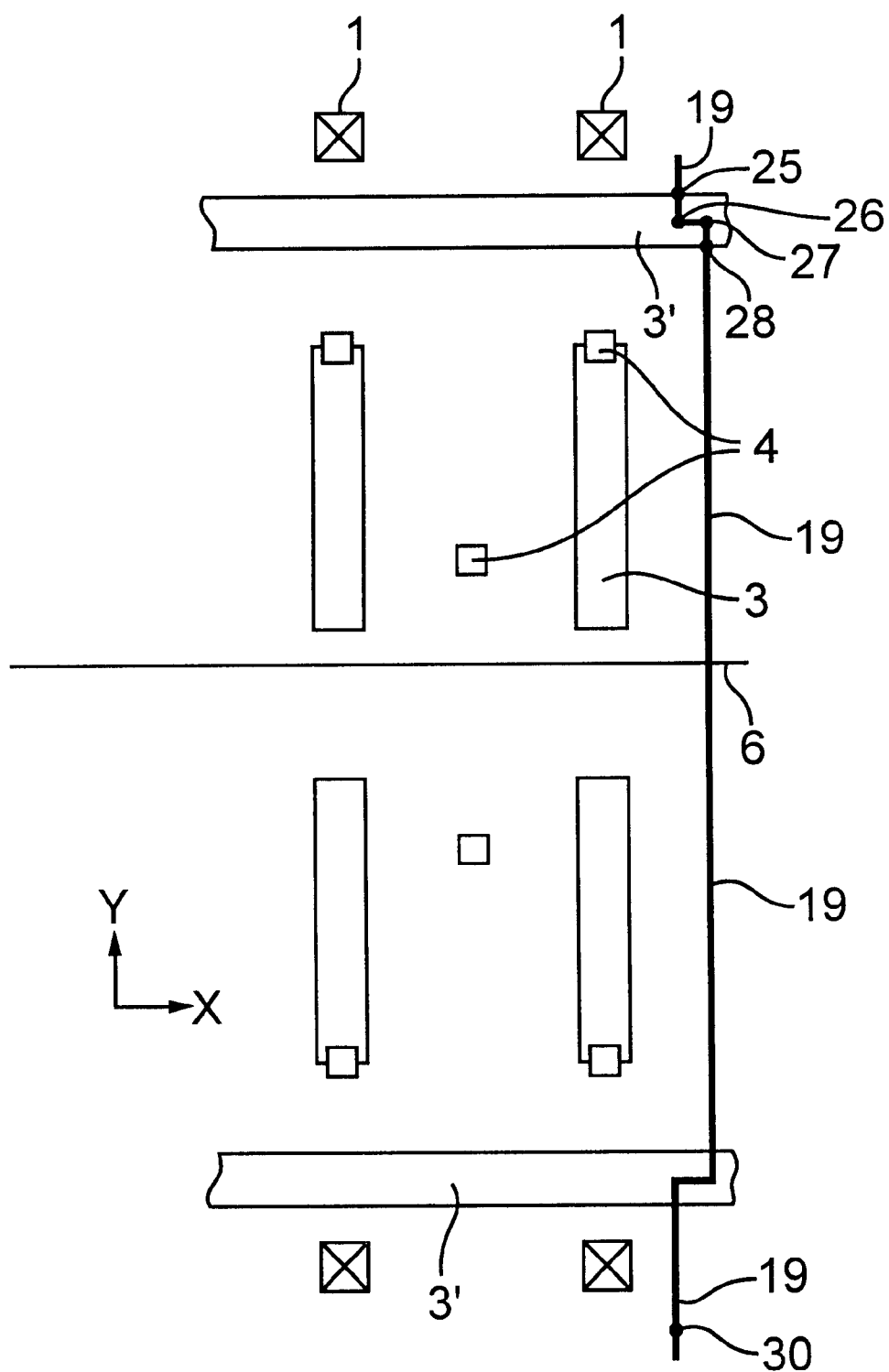
FIG. 2 is a plan view of a first (relative to the FIG. 1 layer) polycrystalline Si layer of the FIG. 1 device.
Figure 3:
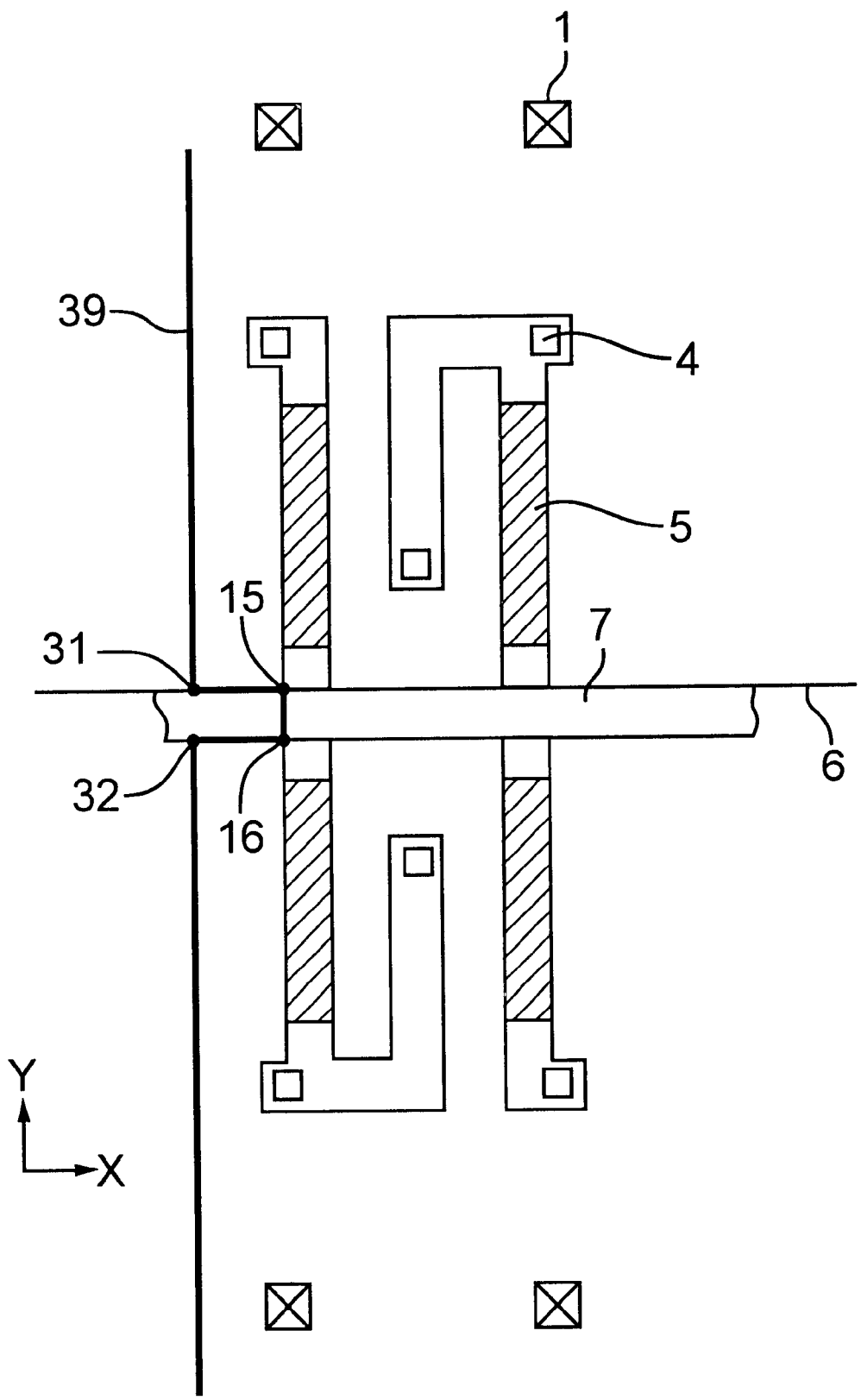
FIG. 3 is a plan view of a second (relative to the FIG. 1 layer) polycrystalline Si layer of the FIG. 1 device pattern.

A representative scheme, according to the invention, for dividing a pattern is now explained with reference to FIGS. 1, 2, and 3. FIGS. 1, 2, and 3 are schematic plan views of exemplary pattern elements and respective subfield division boundaries situated according to the invention. The pattern elements are of a static random-access memory cell (SRAM cell) comprising four transistors and polycrystalline load resistors. FIG. 1 shows mainly the elements defined in a diffusion layer 2, FIG. 2 shows elements defined in a first polycrystalline Si layer 3, and FIG. 3 shows features defined in a second polycrystalline Si layer 7. FIG. 1 also depicts the respective locations of the four transistors TR1–TR4 and their respective sources (S), gates (G), and drains (D).

These figures are based on drawings published in *Nikkei Microelectronics*, 1987, No. 2, page 72. They are not design drawings for an actual SRAM device but rather are schematic drawings to show, by way of example, the inventive concept of pattern division.

Turning first to FIG. 1, elements (delineated by solid lines) defined in a diffusion layer 2 are formed on a Si wafer surface. Elements defined on an overlying first polycrystalline Si layer 3 are delineated by broken lines. Also shown are a bit-line pair 1 and contact holes 4. The diffusion layer 2 forms the respective source S of each transistor TR1–TR4. The first polycrystalline Si layer 3 forms the respective gate G of each transistor TR1–TR4.

The inventive manner of establishing a subfield-division boundary in the diffusion layer 2 is now described. A subfield boundary 6 extends in the lateral direction (i.e., a direction parallel to the X-axis) in FIG. 1. Particular aspects of the subfield boundary 6 are as follows.

(1) The subfield boundary 6 does not cross transistor regions (in the vicinity of the gates 2), which are regions where the tolerance for pattern defects is especially strict. As a result, each transistor region is transferred within a respective subfield so as to avoid subfield-stitching errors within transistors. Each subfield can have more than one transistor.

(2) The bit-line pair 1 and its respective surrounding diffusion layer 2' fall within the same subfield. Hence, in these regions, subfield-stitching errors are not added to overlayer errors, and excellent stitching accuracy is realized.

(3) Intersections of the subfield boundary 6 with the diffusion layer 2, indicated by points 11 in the drawing, desirably are "corners" where the internal angle of the pattern element (diffusion layer 2) has an angle of greater than 225 degrees (here, the angles are 270 degrees).

By configuring the subfield boundary 6 according to the foregoing, even if a subfield-stitching error (e.g., underlap) occurs in the X-axis direction between the adjacent subfields, for example, breaking of the diffusion layer is avoided. This is because the point 11 is a region where enlargement of the projected element occurs readily due to proximity effects. Such enlargement tends to compensate for the adverse effects of subfield-stitching errors (e.g., underlap) that would otherwise cause a break in the pattern element traversed by a subfield boundary.

The subfield boundary 6 extending in the X-axis direction desirably is in the same location on other layers also (i.e., the first polycrystalline Si layer and a second polycrystalline Si layer). Such a configuration reduces overlayer errors between the layers (i.e., between the diffusion layer and the first polycrystalline layer or second polycrystalline layer). Because subfield-stitching errors thus are not added to overlayer errors, positioning accuracy of the diffusion layer with respect to the other layers is further improved.

Next, the pattern-subfield boundary in the vertical direction (i.e., the direction parallel to the Y-axis) is explained. The boundary 9 in the Y-axis direction can be established so as to pass through a different location on each pattern layer as required so as to have the boundary pass through pattern elements at locations where extreme stitching accuracy is not required. Hence, the locations can be established so that subfield-stitching errors do not become conspicuous in each respective layer, and interception of subfield boundaries with pattern-element edges is minimized in each respective layer.

In the diffusion layer 2 shown in FIG. 1, the subfield boundary 9 running parallel to the Y-axis is located so as to avoid transistors, bit-line pairs 1, and contact holes 4. Rather, in regions through which the subfield boundary 9 extends, the diffusion-layer pattern element desirably is relatively large, so little adverse effect occurs even if the stitching together of elements of the diffusion layer extending across the boundary 9 is not ideal. Each point 12 at the intersection of the boundary line 9 and the diffusion layer 2 desirably has an internal angle of at least 180 degrees. Also, at each point 12, the diffusion-pattern element is relatively large, which greatly reduces the effects of subfield-stitching errors.

A representative desirable boundary of the pattern subfield for the first polycrystalline Si layer is now explained with reference to FIG. 2.

FIG. 2 shows the bit-line pair 1 and contact holes 4. FIG. 2 also shows a word line 3', a gate 3, and other elements defined by the first polycrystalline Si layer.

The subfield-division boundary 6, extending parallel to the X-axis, is at the same position as on other layers (e.g., at the same position as shown in FIG.1). The boundary 6 is situated between the bit-line pair 1 and the word line 3', and does not intersect any pattern element in this layer.

A subfield-division boundary 19, extending parallel to the Y-axis, desirably does not directly cross the word line 3', which extends a long distance in the X-axis direction. To avoid a direct crossing, in this example, the boundary 19 bends twice (bend points 26 and 27) in the word line 3'. The points 25 and 28 where the boundary 19 intersects the word line 3' intersect are displaced in the X-axis direction. By placing the boundary and element-edge intersection points at different positions in the X-axis direction, even if there is a relatively small subfield-stitching error between the right and left (in the figure) subfields, the word line 3' is not broken.

Next, a representative desirable boundary of the pattern subfield for the second polycrystalline Si layer is explained with reference to FIG. 3. In FIG. 3, the bit-line pair 1 and contact holes 4 are shown in the second polycrystalline Si layer 7. A portion of the second polycrystalline Si layer 7 defines load-resistor segments 5.

The subfield-division boundary 6, extending parallel to the X-axis, is at the same position as on other layers. Specifically, the boundary 6 is situated between the bit-line pair 1 and the second polycrystalline Si layer 7, and does not intersect a pattern element in this layer.

The subfield-division boundary 39 extends parallel to the Y-axis. Where the subfield-division boundary 39 crosses the second polycrystalline Si layer 7 (extending in the X-axis direction), the boundary 39 is bent at points 31, 15, 16, and 32. The reason for such a bend is to separate the boundary 39 from the transistor region (around the load-resistor pattern 5) as much as possible, and to pass the boundary 39 through locations on the pattern feature (defined by the second polycrystalline Si layer 7) where the internal angle is large (greater than 225 degrees). Here, the angle at points 15 and 16 is 270 degrees.

By establishing subfield-division boundaries as described above, defects caused by subfield-stitching errors and overlayer errors are reduced compared to conventional methods.

Figure 6:
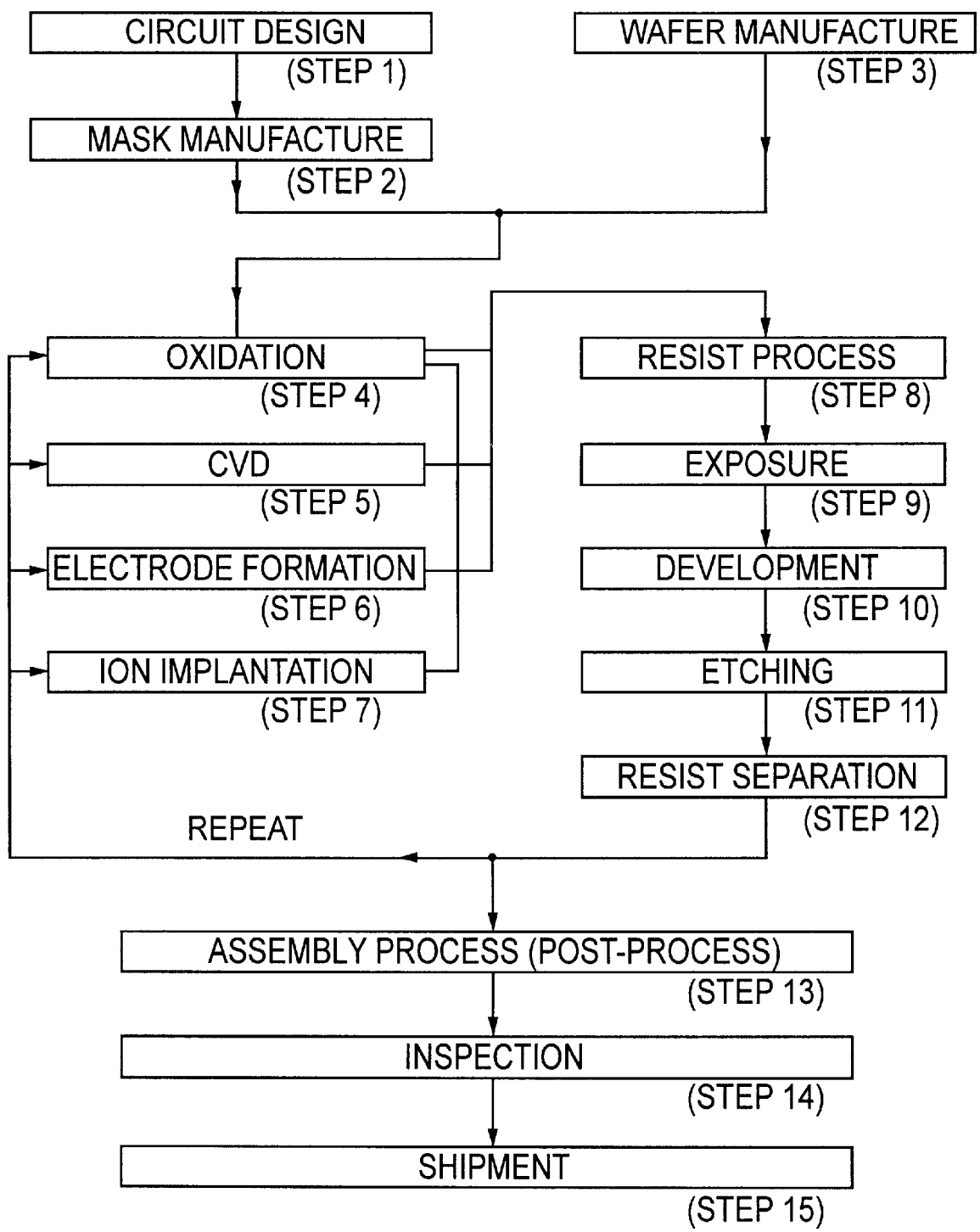
FIG. 6 is a flow chart of steps in a process for manufacturing a semiconductor device such as a semiconductor chip.

FIG. 6 is a flow chart of steps in a process for manufacturing a semiconductor device such as a semiconductor chip (e.g., an integrated circuit or LSI device), a display panel (e.g., liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has been passed through steps 4–12 is formed into semiconductor chips. This step can include, e.g., assembling the devices (dicing and bonding) and packaging (encapsulation of individual chips). Step 14 is an inspection step in which any of various operability and qualification tests of the device produced in step 13 are conducted.

Afterward, devices that successfully pass step 14 are finished, packaged, and shipped (step 16).

Steps 4–12 also provide representative details of wafer processing.

Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ion-implantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are formed superposedly on the wafer.

Whereas the invention is described in connection with representative embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam microlithographic method in which a pattern, defined on a reticle segmented into subfields, is projection-transferred to a sensitive substrate using a charged particle beam, on which sensitive substrate images of the reticle subfields are stitched together to form the pattern layer on the substrate, to be preceded or followed by formation of one or more other layers on the substrate that overlap the pattern layer, a method for defining a reticle pattern on the segmented reticle, comprising:

providing a pattern comprising pattern elements, the pattern including first locations at which overlayer accuracy with an overlying or underlying layer must be relatively high and second locations at which overlayer accuracy with an overlying or underlying layer can be relatively low; and where a subfield boundary must cross one or more pattern features, configuring the subfield boundary to cross the pattern features at the second locations.

2. The method of claim 1, wherein the first location is situated between a respective source and gate of a transistor or between a respective gate and drain of a transistor defined at least in part by the pattern.

3. In a charged-particle-beam microlithographic method in which a pattern, defined on a reticle segmented into subfields, is projection-transferred to a sensitive substrate using a charged particle beam, on which sensitive substrate images of the reticle subfields are stitched together to form the pattern layer on the substrate, to be preceded or followed by formation of one or more other layers on the substrate that overlap the pattern layer, a method for defining a reticle pattern on the segmented reticle, comprising:

providing a pattern comprising pattern elements; and where a subfield boundary must cross a pattern feature, configuring the subfield boundary to cross the pattern feature at a location where the pattern feature exhibits an internal angle of at least 225 degrees.

4. A semiconductor-fabrication process, comprising the steps of:

(a) preparing a wafer;

(b) processing the wafer; and (c) assembling devices formed on the wafer during steps (a) and (b), wherein step (b) comprises the steps of (i)

defining a reticle pattern on a reticle; (ii) applying a resist to the wafer; (iii) exposing the resist with the reticle pattern using charged-particle-beam microlithography; (iv) developing the resist; and (v) removing the resist; and step (i) comprises defining a reticle pattern on a segmented reticle as recited in claim 1.

5. A semiconductor device produced by the method of claim 4.

6. A semiconductor-fabrication process, comprising the steps of:
(a) preparing a wafer;
(b) processing the wafer; and
(c) assembling devices formed on the wafer during steps (a) and (b), wherein step (b) comprises the steps of (i) defining a reticle pattern on a reticle; (ii) applying a resist to the wafer; (iii) exposing the resist with the reticle pattern using charged-particle-beam microlithography; (iv) developing the resist; and (v) removing the resist; and step (i) comprises defining a reticle pattern on a segmented reticle as recited in claim 3.

7. A semiconductor device produced by the method of claim 6.

* * * * *

UNITED STATES PATENT AND TRADEMARK OFFICE
CERTIFICATE OF CORRECTION

PATENT NO. : 6,444,399 B1
DATED : September 3, 2002
INVENTOR(S) : Nakasuji

It is certified that error appears in the above-identified patent and that said Letters Patent is hereby corrected as shown below:

Column 1,
Line 21, "for used" should be -- for use --.

Column 6,
Line 23, "0,5" should be -- 0.5 --.

Signed and Sealed this

Fifteenth Day of July, 2003

JAMES E. ROGAN
*Director of the United States Patent and Trademark Office*